United States Patent
Ku et al.

(10) Patent No.: US 8,048,778 B1
(45) Date of Patent: Nov. 1, 2011

(54) METHODS OF DICING A SEMICONDUCTOR STRUCTURE

(75) Inventors: Chin-Yu Ku, Hsinchu (TW); Hsiu-Mei Yu, Hsinchu (TW); Chun-Ying Lin, Tuku Township (TW); Young-Chang Lien, Taipei (TW); Sheng-Hsiang Chiu, Tainan (TW); Ta-Jen Yu, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/964,964

(22) Filed: Dec. 10, 2010

(51) Int. Cl.
*H01L 21/00* (2006.01)
(52) U.S. Cl. ............................ 438/462; 257/E21.599
(58) Field of Classification Search .................. 438/462, 438/465, 112, 113, 114; 257/620, E21.599
See application file for complete search history.

(56) References Cited

U.S. PATENT DOCUMENTS

| 7,741,196 | B2 | 6/2010 | Yip et al. | |
| 2007/0272668 | A1* | 11/2007 | Albelo et al. | 219/121.72 |
| 2008/0076233 | A1* | 3/2008 | Morishige et al. | 438/463 |
| 2009/0011543 | A1* | 1/2009 | Karta et al. | 438/114 |
| 2010/0072635 | A1* | 3/2010 | Kuo et al. | 257/797 |
| 2010/0197077 | A1* | 8/2010 | Lee et al. | 438/107 |
| 2010/0298467 | A1* | 11/2010 | Stammer et al. | 523/218 |
| 2010/0304551 | A1* | 12/2010 | Takanashi et al. | 438/463 |

* cited by examiner

*Primary Examiner* — Khiem D Nguyen
*Assistant Examiner* — Christine Enad
(74) *Attorney, Agent, or Firm* — Lowe Hauptman Ham & Berner, LLP

(57) ABSTRACT

An embodiment of the disclosure includes a method of dicing a semiconductor structure. A device layer on a semiconductor substrate is provided. The device layer has a first chip region and a second chip region. A scribe line region is between the first chip region and the second chip region. A protective layer is formed over the device layer thereby over the semiconductor substrate. The protective layer on the scribe line region is laser sawn to form a notch. The notch extends into the semiconductor substrate and the protective layer is formed to cover a portion of the notch. A mechanically sawing is performed through the portion of the protective layer and the substrate to separate the first chip region and the second chip region.

20 Claims, 9 Drawing Sheets

METHODS OF DICING A SEMICONDUCTOR STRUCTURE

TECHNICAL FIELD

The disclosure relates generally to semiconductor structure fabrication processes, and more particularly, to a method for dicing a semiconductor substrate.

BACKGROUND

In a typical integrated circuit formation process, semiconductor wafers, each including a plurality of identical semiconductor chips (also referred to as dies), are manufactured first. After manufacturing, the semiconductor wafers are sawed to separate the semiconductor chips, so that each of the semiconductor chips may be packaged individually.

However, the conventional wafer dicing processes have a number of shortcomings. For example, the upper metal layers on the semiconductor substrate may crack during the process enabling contaminants or moisture to penetrate through the die. Therefore, the failure rate of the overall assembly could increase.

Accordingly, there is a need for an improved method to saw the semiconductor wafer into individual dies with robust electrical performance.

BRIEF DESCRIPTION OF THE DRAWINGS

Exemplary embodiments will be described with reference to the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

Figure 1:
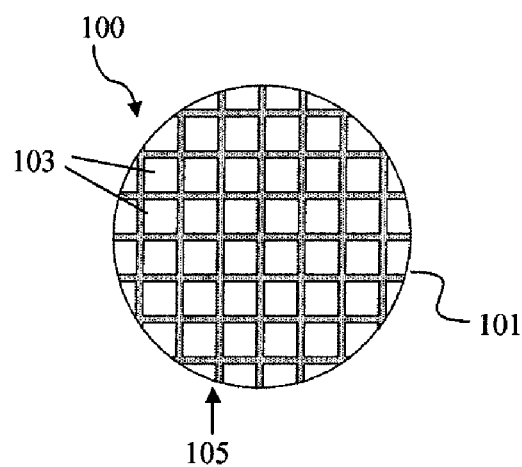
FIG. 1 is a top views of a wafer including a plurality of chip regions.
Figure 2:
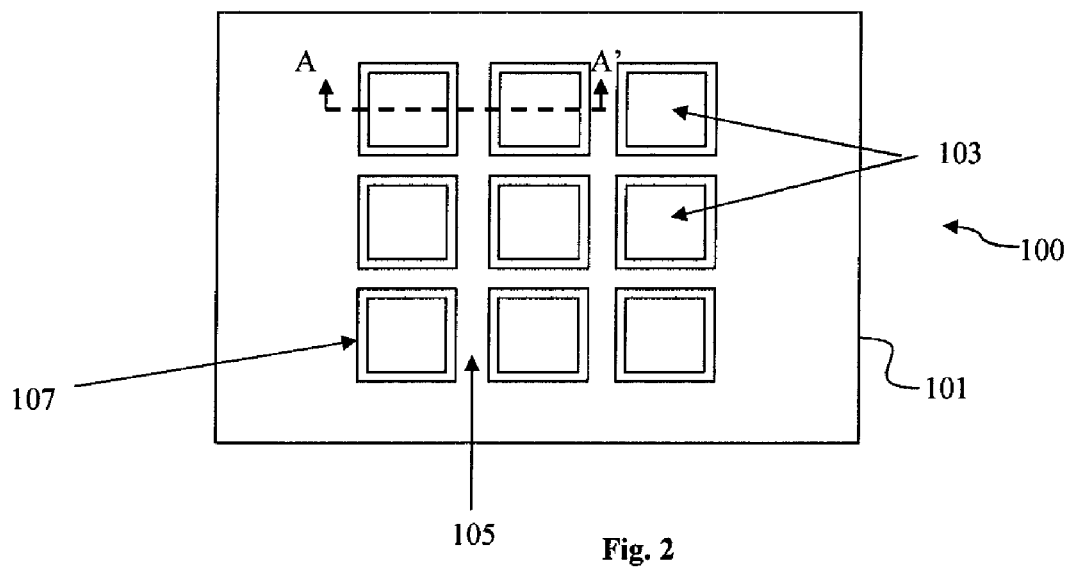
FIG. 2 is an enlarged view of the wafer depicted in FIG. 1.
Figure 3:
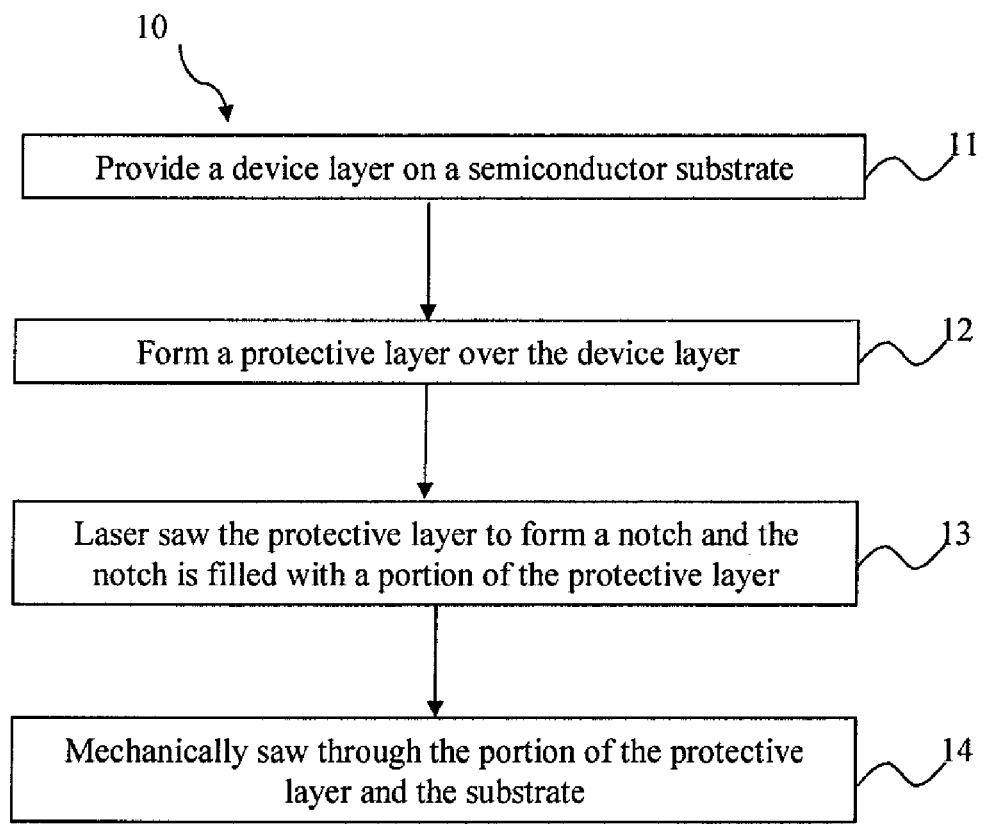
FIG. 3 is a flowchart of method of fabricating semiconductor structures according to embodiments of the disclosure.
Figure 8:
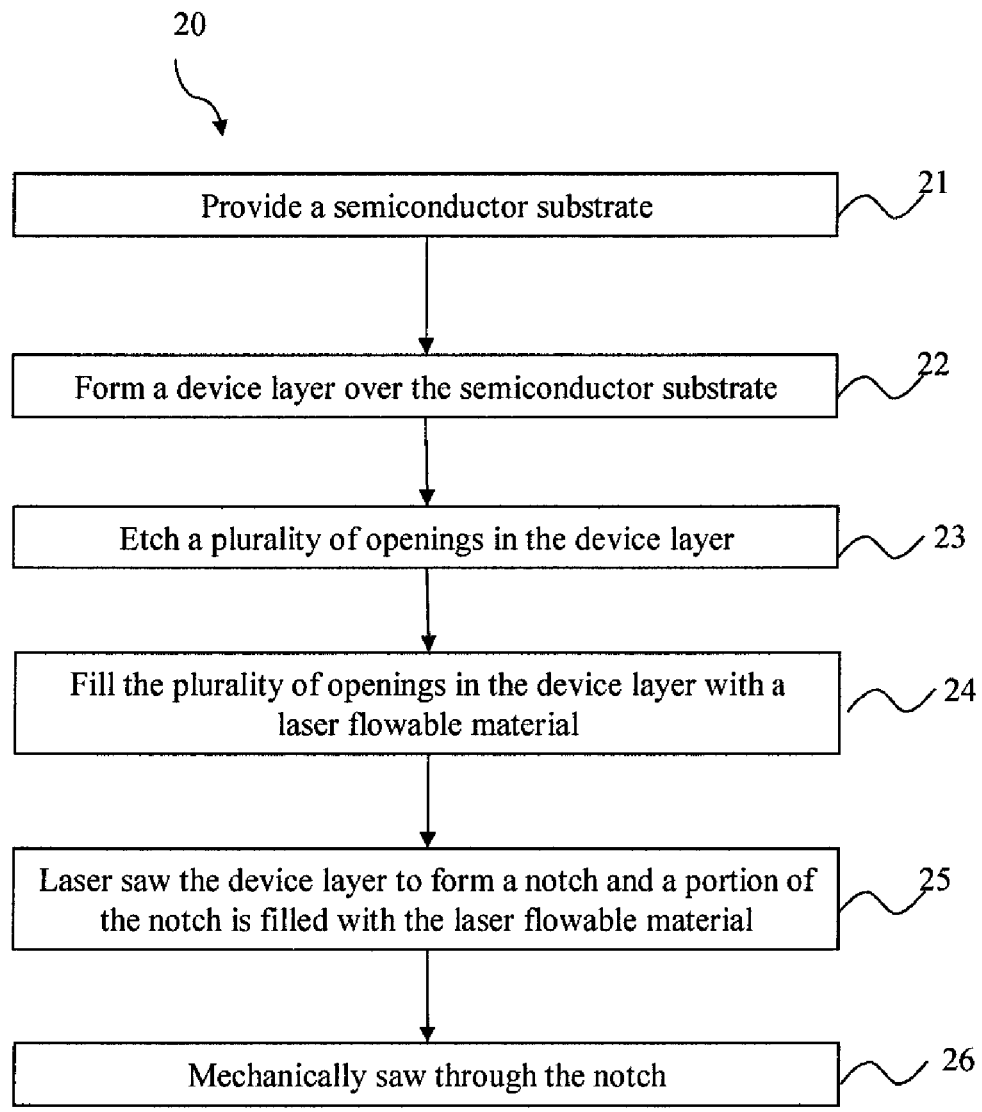
FIG. 8 is another flowchart of method of fabricating semiconductor structures according to embodiments of the disclosure.
Figure 9:
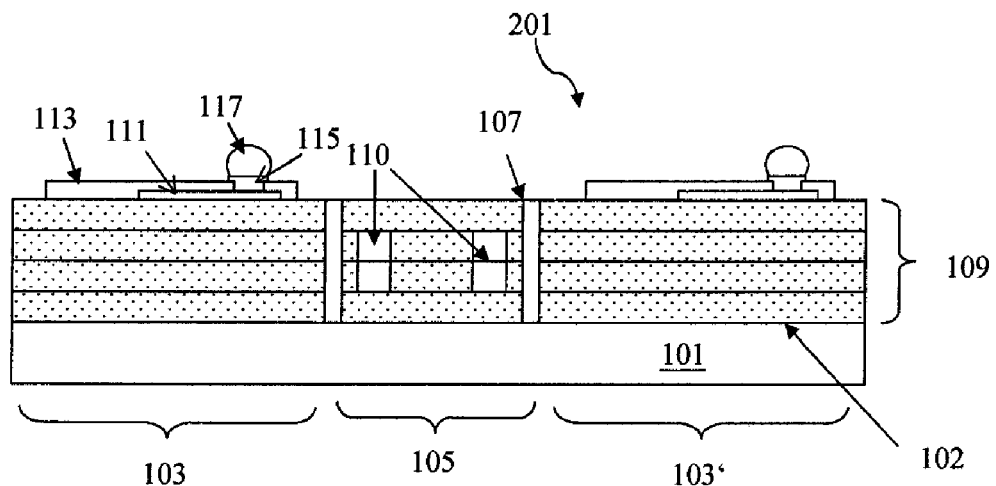
FIG. 9 to FIG. 11 are cross-sectional views showing various stages during fabrication of a structure according to one or more embodiments according to FIG. 8.
Figure 10:
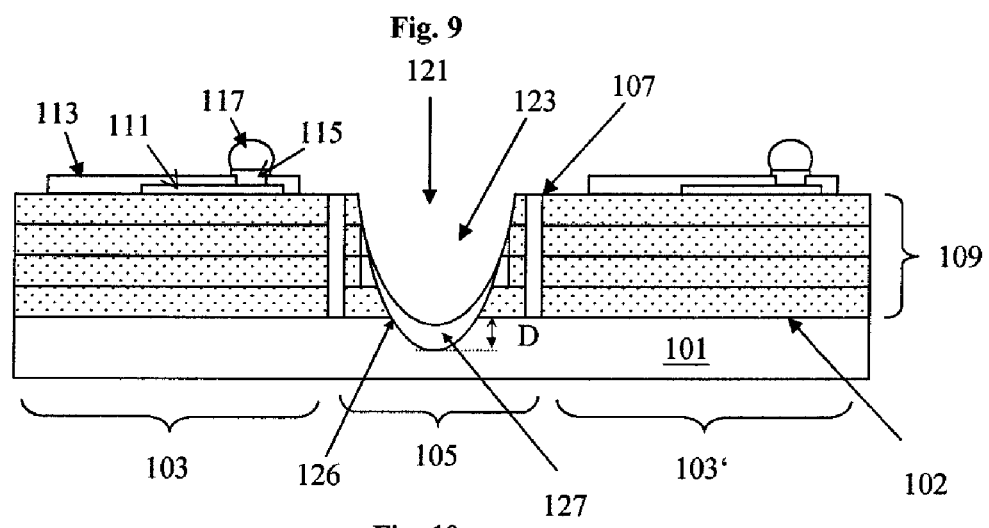
Figure 11:
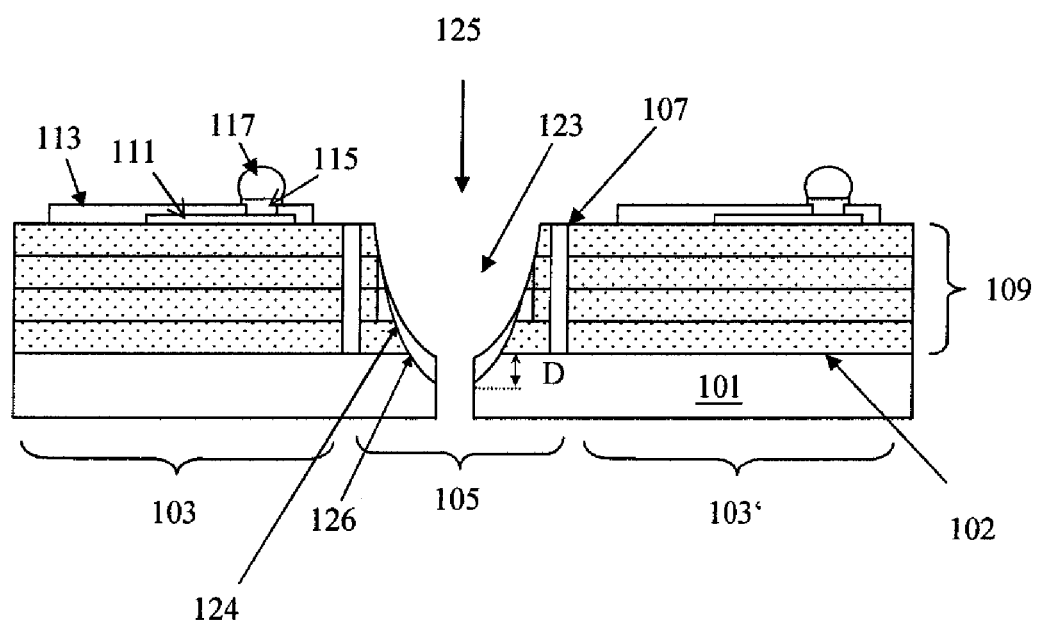

Illustrated in FIG. 1 and FIG. 2 are top views of a wafer including a plurality of chip regions. Illustrated in FIGS. 3 and 8 are flowcharts of methods 10 and 20 of fabricating semiconductor structures according to embodiments of the disclosure. FIG. 4 to FIG. 7 are cross-sectional views showing various stages during fabrication of a semiconductor structure according to one or more embodiments according to FIG. 3. FIG. 9 to FIG. 11 are cross-sectional views showing various stages during fabrication of a semiconductor structure according to one or more embodiments according to FIG. 8

FIG. 1 is a top view of a wafer 100 including a plurality of chip regions 103 fabricated on a semiconductor substrate 101. The plurality of chip regions 103 are divided by scribe lines 105 between the chip regions 103. FIG. 2 is an enlarged view of a portion of the wafer 100 depicted in FIG. 1. The term "wafer" herein generally refers to the semiconductor substrate 101 on which various layers and device structures are formed. The semiconductor substrate 101, in some embodiments, includes silicon or compound semiconductor, such as GaAs, InP, Si/Ge, or SiC. Examples of such layers include dielectric layers, doped layers, and/or polysilicon layers. Examples of device structures include transistors, resistors, and/or capacitors, which may or may not be interconnected through an interconnect layer to additional active circuits. The following process steps will be performed on the plurality of semiconductor chip regions on the surface of the substrate.

Referring now to FIG. 3, method 10 begins with block 11 in which a device layer on a semiconductor substrate is provided. The device layer has a first chip region and a second chip region. A scribe line region is formed between the first chip region and the second chip region. The method 10 continues with block 12 in which a protective layer is formed over the device layer thereby over the semiconductor substrate. The method 10 continues with block 13 in which the protective layer on the scribe line region is laser sawn to form a notch. The notch extends into the semiconductor substrate and is filled with a portion of the protective layer. The method 10 continues with block 14 in which a mechanical sawing is performed through the portion of the protective layer and the substrate to separate the first chip region and the second chip region and the substrate thereunder.

Figure 4:
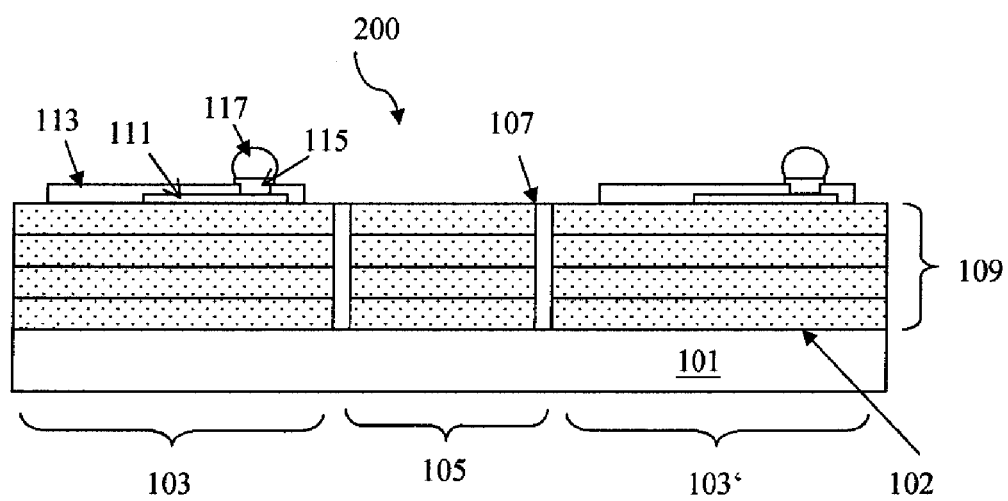
FIG. 4 to FIG. 7 are cross-sectional views showing various stages during fabrication of a structure according to one or more embodiments according to FIG. 3.

FIG. 4 to FIG. 7 are cross-sectional views showing various stages during fabrication of a semiconductor structure according to one or more embodiments according to FIG. 3. FIGS. 4-7 are cross-sectional views obtained from the vertical plane crossing line A-A' in FIG. 2. FIG. 4 provides a structure 200 which contains only a portion of the semiconductor substrate 101 that has two chips regions 103/103' formed thereon. The rest of the semiconductor substrate 101 and other chip regions are omitted in FIGS. 4-7. The structure 200 includes the semiconductor substrate 101, a device layer 109 formed over the semiconductor substrate 101, a bond pad 111 formed over the device layer 109, a passivation 113 formed over the bond pad 111, an UBM 115 formed over the passivaton layer 113, and a conductive feature 117 formed over the UBM 115. The device layer 109 has a first chip region 103 and a second chip region 103'. Each of the first chip region 103 and the second chip region 103' is surrounded by a seal ring 107. A scribe line region 105 is defined between each seal ring 107 of the first chip region 103 and the second chip region 103'.

The fabrication process of the structure 200 is described as following. The semiconductor substrate 101 having a top surface 102 is provided. The device layer 109 is formed over the top surface 102 of the semiconductor substrate 101. The device layer 109 includes a plurality of interconnect layers. The interconnect layers include one or more conductive layers disposed within one or more dielectric layers. The conductive layers electrically connect integrated circuit components, and provide electrical connections from the integrated circuits to the upper layers. In some embodiment, the dielectric layer in the interconnect layers is formed of low-k dielectric materials with dielectric constants (k value) between about 2.9 and 3.8, ultra low-k (ULK) dielectric materials with k values between about 2.5 and about 2.9, or some combination of low-k dielectric materials. Typically, the lower k value a dielectric layer has, the more fragile and prone to delamination and cracking the layer becomes. The interconnect layers also include the seal ring 107 formed to surround the chip regions. The seal ring 107 separates the scribe line region 105 from the chip regions. The seal ring 107 protects the integrated circuits in the chip regions from moisture and contaminations. Also, the seal ring 107 protects the chip regions from damage during dicing process. In at least one embodiment, the seal ring 107 includes a conductive material such as aluminum, aluminum alloy, copper, copper alloy, or combinations thereof.

The bond pad 111 is formed over the device layer 109. The bond pad 111 provides electrical connection between the overlying solder bumps and the underlying integrated circuits through the metal vias (not shown) to the conductive layers in the device layers 109 to complete electrical connection to the underlying integrated circuits. In one embodiment, the bond pad 111 includes an electrically conductive material such as aluminum, aluminum alloy, copper, copper alloy, or combinations thereof. In some embodiment, the bond pad 111 is deposited by physical vapor deposition (PVD) such as a sputtering deposition using a sputtering target made of aluminum, copper or an alloy thereof followed by patterning the deposited layer with photolithography and etching.

Next, the passivation layer 113 is formed over the bond pad 111. The passivation layer 113 absorbs or releases thermal or mechanical stress caused by packaging of the substrate. The passivation layer 113 may be deposited over the bond pad 111 by applicable deposition techniques, such as chemical vapor deposition (CVD). The passivation layer 113 includes one or more layers, such as oxide, undoped silicate glass (USG), silicon nitride (SiN), silicon dioxide ($SiO_2$) or silicon oxynitride (SiON). The passivation layer 113 prevents or decreases moisture, mechanical, and/or radiation damage to the integrated circuits.

The under bump metallurgy (UBM) layer 115 is formed over the passivation layer 113 and contacts a portion of the bond pad 111. In some embodiment, the UBM layer 115 includes multiple layers of conductive materials, such as a layer of titanium, a layer of copper, and/or a layer of nickel. Each layer in the UBM layer 115 is preferably formed using a plating process, such as electrochemical plating, although other processes of formation, such as sputtering, evaporation, electroless plating or PECVD process, may alternatively be used depending upon the desired materials.

Next, in some embodiments, a photoresist layer (not shown) is formed over the UBM layer 115 and developed to form a hole that exposes at least a portion of the UBM layer 115. The photoresist layer acts as a mold for metal deposition process for conductive feature formation. In some embodiment, a conductive material is deposited in the hole by evaporation, electroplating, or screen printing to form a column of conductive feature 117 over the UBM layer 115 as shown in FIG. 4. The conductive material includes any of a variety of metals or metal alloys, such as solder or copper. In at least one embodiment, the conductive feature 117 is a copper pillar. In another embodiment, the conductive feature 117 is a solder, wherein the solder is reflown by heating to form a solder bump.

Figure 5:
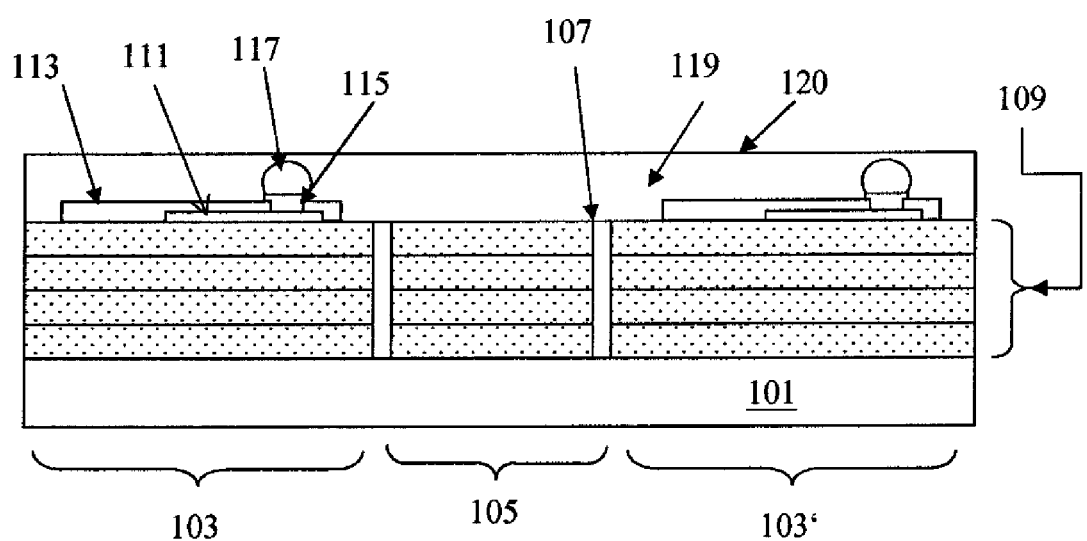

As FIG. 5 shows, a protective layer 119 is formed over the device layer 109 and covers the passivation layer 113, the UBM 115 and the conductive feature 117. In at least one embodiment, the protective layer 119 is attached on a carrier. Next, the carrier is flipped over and the protective layer 119 faces down to the device layer 109. Then, the carrier is pressed down toward the device layer 109 and the protective layer 119 is formed over the device layer 109. Finally, the carrier is removed. The protective layer 119 comprises a flowable composite resin, which is flowable during a temperature range of about 50° C. to about 150° C.

Figure 6:
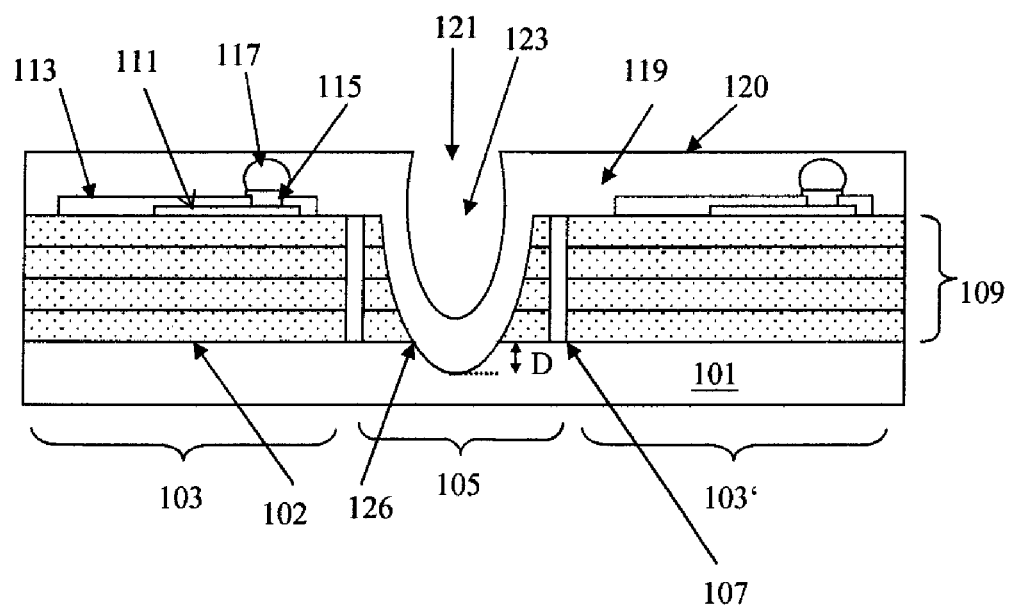

Referring to FIG. 6, the protective layer 119 over the scribe line region 105 and the scribe line region 105 are laser sawn 121 to form a notch 123. The notch 123 extends from a top surface of the protective layer 119 to a depth of about 5 μm to 10 μm of the semiconductor substrate 101. The notch 123 also extends along one end of the scribe line region 105 to an opposite end of the scribe line region 105. A portion of the protective layer 119 being melted because of the heat caused by the laser and flows in the notch 123 and fills the notch 123. Also, the protective layer 119 in the notch 123 covers an interface 126 of the device layer 109 and the semiconductor substrate 101. In one embodiment, the laser sawing uses an Argon (Ar) based ion laser beam tool, manufactured by DISCO. An operation power of the laser sawing is about 0.4 W to about 4 W at a temperature about 2000° C. of the laser beam. The protective layer 119 is heated to become flowable before or during laser sawing. The heating temperature is about 50° C. to about 150° C. for 20 minutes. After laser sawing, the protective layer 119 is cured in a temperature range of 50° C. to about 150° C. for 2 hours to harden the protective layer 119. Advantageously, the protective layer 119 has the effect of reducing chip edge cracked or broken in later mechanically die sawing process. Crack, peeling, or delamination is less likely to occur in weak layers, such as low dielectric constant layers.

Figure 7:
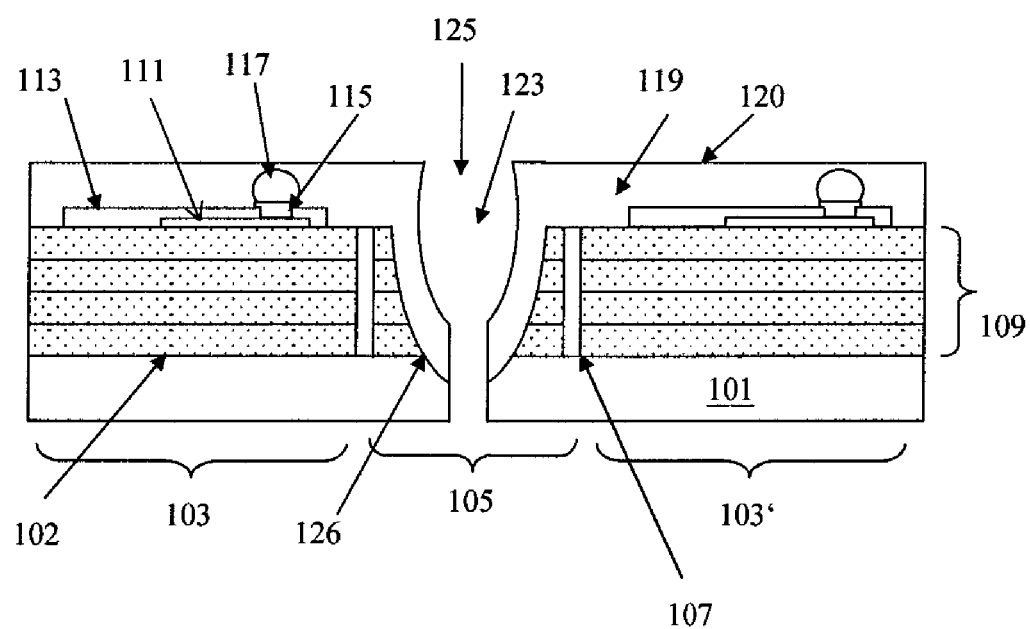

Referring to FIG. 7, a mechanically sawing 125 is performed through the portion of the protective layer 119 and the semiconductor substrate 101 to separate the first chip region 103 and the second chip region 103'. The plurality of chip regions on the wafer 100 are sawed into individual chip regions and, in some embodiments, the substrate thereunder.

Referring now to FIG. 8, FIG. 8 is another method for fabricating semiconductor structures according to embodiments of the disclosure. The method 20 begins with block 21 in which a semiconductor substrate is provided. The method 20 begins with block 22 in which a device layer is formed over the semiconductor substrate. The device layer has a first chip region and a second chip region. A scribe line region is defined between the first chip region and the second chip region. The method 10 continues with block 23 in which a plurality of openings in the device layer in the scribe line region are etched. The method 10 continues with block 24 in which the plurality of openings in the device layer are filled with a laser flowable material. The method 10 continues with block 25 in which the device layer on the scribe line region is laser sawn to form a notch. The notch extends into the semiconductor substrate. A portion of the notch is covered by the laser flowable material. The method 10 continues with block 26 in which a mechanically sawing is performed through the notch to separate the first chip region and the second chip region.

FIG. 9 to FIG. 11 are cross-sectional views showing various stages during fabrication of a semiconductor structure according to one or more embodiments according to FIG. 8. FIG. 9 illustrates a variation of the process steps of FIG. 4 in the formation of the structure 201. The repetitive numerals in FIG. 9 refer to the same or similar elements shown in FIG. 4.

Referring to FIG. 9, the structure 201 is illustrated. The device layer 109 is formed over the semiconductor substrate 101. The device layer 109 comprises a plurality of interconnect layers. The interconnect layers include one or more conductive layers disposed within one or more dielectric layers. The seal ring 107 surrounds each of the first chip region 103 and the second chip region 103'. The seal ring 107 separates the first chip region 103, the second chip region 103' and the scribe line region 105. Then, one or more openings are etched in the device layer 109 in the scribe line region 105. The openings are filled with a laser flowable material 110. Next, the bond pad 111 is formed over the device layer 109. The passivation 113 is formed over the bond pad 111. The UBM 115 is formed over the passivaton layer 113 and the conductive feature 117 is formed over the UBM 115.

In FIG. 9, the laser flowable material 110 comprises a solder, such as Tin alloy, or a metal alloy that is flowable under the operation temperature of laser sawing at 2000° C. of the laser beam. In at least one embodiment, the openings that filled with laser flowable material 110 are at the opposite sides of the seal rings 107 with respect to the first chip region 103 and the second chip region 103'. In at least one embodiment, an opening filled with the laser flowable material 110 is formed in at least one of the interconnect layers. In other embodiment, an opening filled with the laser flowable material 110 extends along one end of the scribe line region 105 to an opposite end of the scribe line 105. In another embodiment, openings filled with the laser flowable material 110 are arranged as separate segments extending along one end of the scribe line region 105 to an opposite end of the scribe line 105.

Referring to FIG. 10, a laser sawing process 121 is performed at the device layer 109 on the scribe line region 105 to form a notch 123. The notch 123 extends from a top surface of the device layer 109 into a distance of about 5 μm to 10 μm of the semiconductor substrate 101. The notch 123 also extends along one end to an opposite end of the scribe line 105. A portion of the notch 123 is covered by the laser flowable material 110. Also, the laser flowable material 110 in the notch 123 covers an interface 126 of the device layer 109 and the semiconductor substrate 101. In at least one embodiment, the laser sawing uses an Ar based ion laser beam tool, manufactured by DISCO. An operation power of the laser sawing is about 0.4 W to about 4 W at a temperature about 2000° C. of the laser beam. The laser flowable material 110 is softened to become flowable during laser sawing. The laser flowable material 110 flows out the plurality of the openings and fills the portion of the notch 123. Then, the softened laser flowable material is solidified. Advantageously, the laser flowable material 110 in the notch 123 has the effect of reducing wafer edge cracked or broken in later mechanically die sawing process. Crack, peeling or delamination is less likely to occur in weak layers, such as low dielectric constant layers.

Referring to FIG. 11, a mechanically sawing 125 is performed through the notch 123, the laser flowable material 110 and the semiconductor substrate 101 to separate the first chip region 103 and the second chip region 103' and, in some embodiments, the substrate thereunder. The chip regions on the wafer 100 are sawed into individual chip regions.

Various embodiments of the present application may be used to moderate the shortcomings of the conventional wafer dicing processes. For example, in the various embodiments the protective layer 119 or the laser flowable material 110 in the notch provides a rigid support for the edge portion of the chips during sawing process. Therefore, crack, peeling, or delamination is less likely to occur in weak layers, such as low dielectric constant layers. The yield of the packing process is thus significantly increased.

Although exemplary embodiments and the respective advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present application. Accordingly, the appended claims are intended to include within their scope such processes, machines, manufacture, compositions of matter, means, methods, or steps.

The invention claimed is:

1. A method comprising:
providing a device layer over a semiconductor substrate, the device layer having a first chip region and a second chip region, and a scribe line region between the first chip region and the second chip region;
forming a protective layer over the device layer;
laser sawing the protective layer on the scribe line region to form a notch, the notch extending into the substrate and filled with a portion of the protective layer melted by the laser sawing; and
mechanically sawing through the portion of the protective layer and the semiconductor substrate to separate the first chip region and the second chip region.

2. The method of claim 1, further comprising heating the protective layer to become flowable during laser sawing.

3. The method of claim 2, wherein protective layer becomes flowable in a temperature range of about 50° C. to about 150° C.

4. The method of claim 1, further comprising curing the protective layer after laser sawing.

5. The method of claim 4, wherein the protective layer is cured in a temperature range of about 50° C. to about 150° C.

6. The method of claim 1, wherein the protective layer covers an interface of the device layer and the semiconductor substrate after the portion of protective layer fills the notch.

7. The method of claim 1, wherein the protective layer comprises a flowable composite resin.

8. The method of claim 1, wherein the notch extends from one end of the scribe line region to an opposite end of the scribe line region.

9. The method of claim 1, wherein the device layer comprises a plurality of interconnect layers.

10. The method of claim 1, wherein the notch extends into the substrate to a depth of about 5 μm to 10 μm.

11. A method comprising:
forming a device layer over a semiconductor substrate, the device layer having a first chip region and a second chip region, and a scribe line region between the first chip region and the second chip region;
etching a plurality of openings in the device layer in the scribe line region;
filling the plurality of the openings with a laser flowable material;
laser sawing the device layer on the scribe line region to form a notch, the notch extending into the semiconductor substrate and a portion of the notch covered by the laser flowable material that becomes flowable during the laser sawing; and
mechanically sawing through the notch to separate the first chip region and the second chip region.

12. The method of claim 11, wherein the laser sawing further comprises:

softening the laser flowable material by the laser sawing thereby flowing laser flowable material out of the plurality of the openings and covering the portion of the notch; and solidifying the softened laser flowable material.

13. The method of claim 11, wherein the laser flowable material comprises a solder or a metal alloy that is flowable during of laser sawing.

14. The method of claim 13, wherein the laser flowable material becomes flowable in a temperature about 2000° C.

15. The method of claim 11, wherein the laser flowable material covers an interface of the device layer and the semiconductor substrate after laser sawing.

16. The method of claim 11, wherein the device layer comprises a plurality of interconnect layers, and the laser flowable material is filled in at least one of the plurality of interconnect layers.

17. The method of claim 11, further comprising seal rings surrounding each of the first chip region and the second chip region, and the openings filled with the laser flowable material are at the opposite sides of the seal rings with respect to the surrounded first chip region and the second chip region.

18. The method of claim 11, wherein the opening filled with the laser flowable material extends from one end of the scribe line region to an opposite end of the scribe line region.

19. The method of claim 11, wherein the device layer comprises a low-k dielectric layer.

20. The method of claim 11, wherein the openings filled with the laser flowable material are arranged in separate segments extending from one end of the scribe line region to an opposite end of the scribe line region.

* * * * *